US006713762B2

(12) United States Patent
Parsons

(10) Patent No.: US 6,713,762 B2
(45) Date of Patent: Mar. 30, 2004

(54) ACOUSTIC ABSORPTION ELECTROMAGNETIC RADIATION SENSING WITH SIC

(75) Inventor: James D. Parsons, Reno, NV (US)

(73) Assignee: Heetronix, Reno, NV (US)

( * ) Notice: Subject to any disclaimer, the term of this patent is extended or adjusted under 35 U.S.C. 154(b) by 123 days.

(21) Appl. No.: 09/906,441

(22) Filed: Jul. 16, 2001

(65) Prior Publication Data

US 2003/0010917 A1 Jan. 16, 2003

(51) Int. Cl.$^7$ ................................................. G01J 5/00
(52) U.S. Cl. ........................................ 250/338.1; 338/18
(58) Field of Search ........................ 250/338.1; 338/18

(56) References Cited

U.S. PATENT DOCUMENTS

| | | | |
|---|---|---|---|
| 4,695,733 A | 9/1987 | Pesavento | 250/551 |
| 5,025,243 A | 6/1991 | Ichikawa | 338/19 |
| 5,122,668 A * | 6/1992 | Kajiwara et al. | 338/18 |
| 5,868,497 A | 2/1999 | Jung | 374/179 |
| 6,239,432 B1 * | 5/2001 | Parsons | 250/338.1 |

OTHER PUBLICATIONS

Jeffrey B. Casady et al., A Hybrid 6H–SiC Temperature Sensor Operational from 25° C. to 500° C., IEEE Transactions on Components, Packaging and Manufacturing Technology—Part A, vol. 19, No. 3 (Sep. 1996, pp 416–422.

Takeshi Nagal and Masahiko Itch, "SiC Thin–Film Thermistors", IEEE Transactions on Industry Applications, vol. 26, No. 6, Nov./Dec. 1990, pp. 1139–1143.

Spitzer et al., "Infrared Properties of Hexagonal Silicon Carbide", Physical Review, Vo. 113, No. 1, pp. 127–132, Jan. 1, 1959.

Choyke,W.J., *Optical and Electronic Properties of SiC* NATO ASI Series vol. *"The Physics and Chemistry of Carbides, Nitrides and Borides"*, Manchester, England, Sep., 1989, pp. 1–25.

Electronic Properties Information Center, "Silicon Carbide", Hughes Aircraft Company, Jun. 1965, pp. 9–16.

M.I. Iglitsyn, et al., "Galvanomagnetic Effects in n–Type Silicon Carbide at Low Temperatures", Soviet Physics—Solid State, vol. 6, No. 9, Mar. 1995, pp. 2129–2135.

O.A. Golikova et al., Electrical Properties Of β–SiC Heavily Doped with Nitrogen, Soviet Physics—Semiconductors, vol. 5, No. 5, Sep. 1971, pp. 366–369.

*Materials for High Temperature Semiconductor Devices*: Committee on Materials for High–Temperature Semiconductor Devices, National Materials Advisory Board, Commission on Engineering and Technical Systems, National Research Council: National Academy Press, Washington, D.C., 1995, pp. 68–70.

O. Nennewitz, L. Spiess and V. Breternitz, *"Ohmic Contacts to 6H–SiC"*, Applied Surface Science, vol. 91, 1995, pp. 347–351.

(List continued on next page.)

*Primary Examiner*—Constantine Hannaher
(74) *Attorney, Agent, or Firm*—Koppel, Jacobs, Patrick & Heybl

(57) ABSTRACT

Single crystal SiC at least 200 micrometers thick is employed to detect electromagnetic radiation having a wavelength less than about 10 micrometers via an acoustic absorption mechanism. Applications include IR radiation sensing, contactless temperature sensing and an IR controlled varistor.

28 Claims, 1 Drawing Sheet

OTHER PUBLICATIONS

J.A. Lely and F.A. Kroeger, *"Electrical Properties of Hexagonal SiC Doped with N, B or Al"*, In Semiconductors and Phosphors, Proceedings of Intl. Colloquium–Partenkirchen, Ed. N. Schoen and H. Welker, New York, Interscience Pub., Inc. 1958, pp. 525–533.

Q.Y. Tong, U. Gosele, C. Yuan, A.J. Stecki & M. Reiche, *"Silicon Carbide Wafer Bonding"*, J. Electrochem Soc., vol. 142, No. 1. Jan. 1995, pp. 232–236.

P.K. Bhattacharys, *"Bonding of SiC Slabs for Electro–Mechanical Heat–Sinks in Advanced Packaging Applications"*, J. Electronics, vol. 73, No. 1, 1992, pp. 71–83.

Westinghouse Astronuclear Laboratory *"Silicon Carbide Junction Thermistor"*, 1965.

De Vasconcelos E A et al: "Highly sensitive thermistors based on high–purity polycrystalline cubic silicon carbide" Sensors and Actuators A, Elsevier Sequoia S.A., Lausanne, CH, vol. 83, No. 1–3, May 2000 (2000–05), pp. 167–171, XP004198310 ISSN: 0924–4247.

De Vasconcelos E A et al: "Potential of high–purity polycrystalline silicon carbide for thermistor applications" Japanese Journal of Applied Physics, Part 1 (Regular Papers, Short Notes & Review Papers), Sep. 1998, Publication Office, Japannese Journal Appl. Phys. Japan, vol. 37, No. 9A, pp. 5078–5079, XP002211060 ISSN: 0021–4922.

* cited by examiner

ACOUSTIC ABSORPTION ELECTROMAGNETIC RADIATION SENSING WITH SIC

BACKGROUND OF THE INVENTION

1. Field of the Invention

This invention relates to the use of SiC for electromagnetic radiation sensing and resistance control.

2. Description of the Related Art

Acoustic absorption, bandgap absorption and impurity absorption refer to three different radiation absorption mechanisms. Acoustic absorption results from increasing lattice vibration under radiation exposure. This is a desirable absorption mechanism when detection is sought over a broad range of wavelengths, since it causes the resistance of a SiC chip to increase approximately linearly with the irradiating energy over an appreciable wavelength range. SiC absorbs heat throughout its volume, not just along its surface, and therefore has a high thermal capacity for absorbing high laser doses and other applications. While it would be desirable to employ SiC for detecting infrared (IR) radiation and other lower wavelength radiation, acoustic absorption has not been observed in SiC for wavelengths below about 10 micrometers, thus eliminating part of the IR band along with shorter wavelengths.

Bandgap absorption occurs at a specific wavelength corresponding to a material's bandgap energy (the energy differential between its conductance and valence bands) SiC can occur in more than 70 different polytypes, each of which has its own distinguishing bandgap energy as measured parallel to the c-axis of a single crystal. The cubic crystalline form of SiC (referred to as 3C-SiC or β-SiC) has the lowest energy bandgap (approximately 2.3 eV), with the longest corresponding wavelength (approximately 0.55 microns) of all SiC crystal structures and polytypes, but this is yellow/green light entirely outside the IR range. The bandgaps of all other SiC crystal structures and polytypes are higher in energy with shorter wavelengths, making SiC unsuitable for bandgap absorption detection of IR.

With impurity absorption, a dopant is introduced into a host material and radiation is detected at the energy differential between the host and dopant conductive band energy levels (for an n-type dopant) or valence band energy levels (for a p-type dopant). The resistance of a chip of host material drops exponentially with the radiation energy at the specific wavelength corresponding to the impurity absorption energy but not at other wavelengths, resulting only in a discrete detectable wavelength. Impurity absorption has been observed with SiC in the IR range (Air Force Materials Laboratory, "Silicon Carbide Absorption", Hughes Aircraft Company Electronic Properties Information Center, pages 9–16), but only at specific wavelengths corresponding to particular impurities. No IR absorption mechanism over a broad band has been discovered.

SUMMARY OF THE INVENTION

The present invention achieves electromagnetic radiation detection at wavelengths shorter than about 10 micrometers, with a detector that has both a high thermal capacity and an output that varies approximately linearly with the radiating energy, by utilizing a previously unknown acoustic absorption mechanism for SiC. By using single crystal SiC with a thickness of at least 200 micrometers, it has been discovered that an acoustic absorption mechanism exists that can be used to detect radiation at less than 10 micrometers. The invention is particularly useful for IR detection, and can be adapted for narrow band detection by the use of an appropriate spectral filter.

BRIEF DESCRIPTION OF THE DRAWINGS

These and other features and advantages of the invention will be apparent to those skilled in the art from the following detailed description of preferred embodiments, taken together with the accompanying drawing, in which.

DETAILED DESCRIPTION OF THE INVENTION

Figure 1:
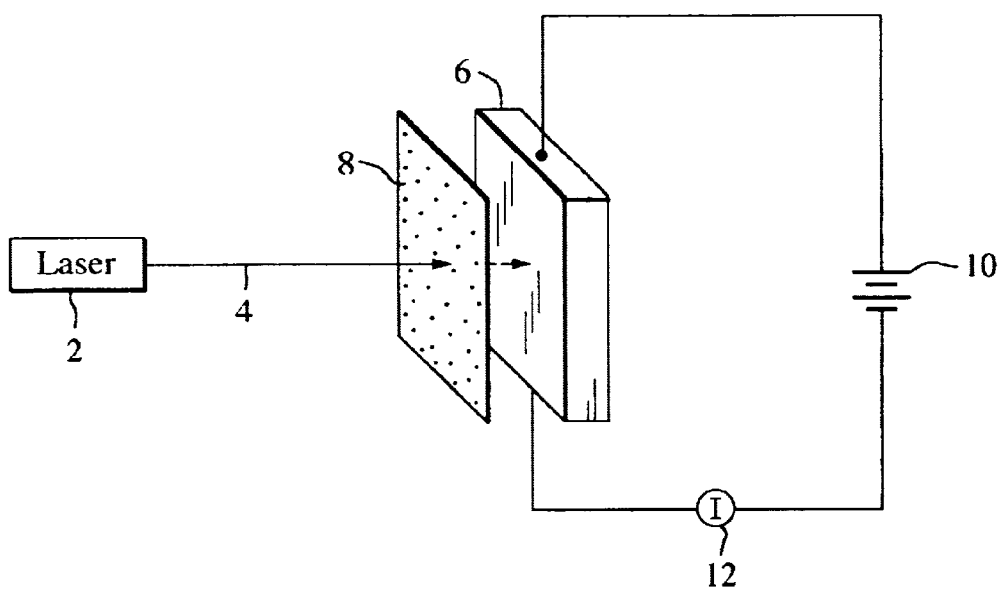
FIG. 1 is a simplified schematic diagram of the invention used to sense the energy of an IR laser beam.

The invention employs SiC as a radiation sensor at wavelengths below about 10 micrometers, and is particularly valuable for IR sensing within this range. Applications include the sensing of radiation power or energy emitted from a radiation source such as a laser, contactless sensing of the temperature of other bodies which are heated by IR radiation, and controlled varistors for electrical circuits.

Whereas no acoustic absorption has been observed for SiC at wavelengths below about 10 micrometers, applicant has discovered that a useful acoustic absorption mechanism can be obtained from SiC if it has a single crystal structure and its thickness is at least about 200 micrometers. While there may be some acoustic absorption with thinner samples, the amount is so small that it has not previously been observed. IR radiation absorbed via acoustic absorption is converted directly into heat energy and causes the resistance of the SiC to increase roughly linearly with the IR energy, as opposed to impurity absorption which causes the SiC resistance to drop.

Among the IR applications for SiC are beam energy and power sensing, for example to sense the energy or power of an IR laser beam or focused radiation from an IR lamp. SiC is particularly advantageous for these applications, since it can absorb very high energy doses over very short time periods without being damaged. Thus, it can be used for energy/power sensing of emitted energy from medium power (powers in the range of 10 watts–300 watts) and many high power (powers in excess of 300 watts) IR lasers, with the SiC sensing surface exposed to the entire output energy without fan or water cooling, withstanding temperatures in excess of 1300 degrees C. The superior high power density handling capability of SiC permits the use of smaller volume SiC sensor elements, relative to those now employed, for a given power level. Furthermore, the smaller size of SiC sensor elements facilitates self-cooling after absorbing a laser pulse more rapidly than other materials used to sense IR radiation. The high thermal conductivity of SiC provides for a rapid distribution of absorbed energy over the entire sensor volume, which substantially reduces the susceptibility of the sensor element to damage and thermal shock from large lateral temperature gradients that may be induced when a small area of a sensor element is exposed to a high energy laser beam. The low piezoelectric coefficient of SiC (relative to pyroelectric materials), coupled with its high thermal conductivity (higher than Cu at room temperature), inhibits the generation of large piezoelectric signals in the sensor from focused laser beams. In general, the favorable thermal shock tolerance of SiC allows it to absorb laser pulses containing high energy, and to be used for relatively long exposures to IR radiation at high energy/power intensities in a small volume and area sensor.

The use of SiC as an IR radiation energy sensor is illustrated in FIG. 1. An IR radiation source such as laser 2 emits an IR beam 4 within a specified waveband (defined herein to include a single wavelength). An SiC sensor body 6 is placed in the beam path, preferably receiving the entire beam. An optional spectral filter 8 of standard construction may be placed in the beam path prior to the sensor body 6 if it is desired to restrict the radiation reaching the sensor to a single wavelength or other narrow waveband. For example, if it is desired to detect radiation at only a specified wavelength, the filter 8 would be tuned to that wavelength and block radiation at other wavelengths.

A constant voltage source 10 applies a constant voltage across the SiC body, while a current sensor 12 senses the resulting current through the SiC. The SiC temperature changes in response to the received IR radiation, with a corresponding resistance change that depends upon the radiation wavelength(s), intensity and exposure time. Since there is a fixed relationship between the SiC temperature and its resistance for a given sample, the SiC temperature can be determined as a function of the current flowing through it, as sensed by the current meter 12. There is also a direct correspondence between the IR radiation energy absorbed by the SiC and its temperature. Accordingly, the current response of the SiC will vary in a one-to-one relationship with the IR beam energy. Calibrating the current meter 12 to the SiC's resistance temperature coefficient, and also to cancel the effect of any current-induced heating, thus allows for a direct readout of the IR beam energy.

Rather than applying a constant voltage and sensing the resulting SiC current as in FIG. 1, a constant current could be applied with the output circuit and the resulting SiC voltage response sensed. Differentiating the instantaneous rate at which the SiC resistance, and thus its temperature, changes can provide a direct indication of the instantaneous power in the IR beam.

The SiC body can be doped, but the purest acoustic absorption response is obtained when it is intrinsic. While the primary immediate application of the invention is considered to be in the IR range, it is also applicable to lower wavelengths, in the visible through ultraviolet (UV) regions.

The invention produces a very stable and reproducible resistance vs temperature characteristic, and can withstand both absolute temperatures of at least 1400° C. and very rapid temperature ramping without the need for fan or water cooling. It is robust and not easily damaged, maintains calibration well, and offers improvements in the ability to withstand high IR energy/power intensities, exposure times and thermal shock. Small SiC devices can be used because of their favorable high power density handling capabilities, without being subject to large piezoelectric signals that can be induced in other materials by focused laser pulses.

Other radiation absorbent applications for SiC, such as contactless temperature sensing and varistors, as well as a preferred technique for mounting the SiC body in a mounting structure having an AlN substrate with a W, WC or W$_2$C mounting layer, are described in U.S. Pat. No. 6,239,432, issued May 29, 2001 to the present inventor, the contents of which are incorporated herein.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An electromagnetic radiation detection system, comprising:
    a body of single crystal SiC at least 200 micrometers thick,
    a source of electromagnetic radiation having a wavelength less than about 10 micrometers, and
    a detector arranged to detect a response of said SiC body to radiation from said source.

2. The system of claim 1, wherein said detector is arranged to detect acoustic absorption by said SiC body of radiation from said source.

3. The system of claim 2, wherein said radiation source emits infrared (IR) radiation.

4. The system of claim 2, wherein said detector is arranged to detect increases in the resistance of said SiC body in response to said body receiving radiation from said source.

5. The system of claim 2, further comprising a filter arranged to limit the reception of radiation from said source by said SiC body to a narrow wavelength band.

6. An electromagnetic radiation detection system, comprising:
    a body of single crystal SiC,
    a source of electromagnetic radiation having a wavelength less than about 10 micrometers, and
    a detector arranged to detect acoustic absorption of radiation from said source by said SiC body.

7. The system of claim 6, wherein said detector is arranged to detect increases in the resistance of said SiC body in response to said body receiving IR radiation from said source.

8. The system of claim 6, wherein said radiation source emits infrared (IR) radiation.

9. The system of claim 6, further comprising a filter arranged to limit the reception of radiation from said source by said SiC body to a narrow wavelength band.

10. An electromagnetic radiation detection method, comprising:
    irradiating a body of SiC with radiation having a wavelength less than about 10 micrometers, and
    detecting acoustic absorption of said radiation by said body.

11. The method of claim 10, wherein said SiC body is irradiated with infrared (IR) radiation.

12. The method of claims, wherein said acoustic absorption is detected by detecting increases in the resistance of said SIC body in response to said radiation.

13. The method of claim 10, wherein said acoustic absorption is detected over a broad band of wavelengths.

14. The method of claim 10, further comprising the step of filtering said radiation to a narrow wavelength band prior to irradiating said SIC body.

15. An electromagnetic radiation detection system, comprising:
    a body of single crystal SiC at least 200 microns thick thick, and
    a detector arranged to detect acoustic absorption of electromagnetic radiation having a wavelength less than about 10 micrometers by said SiC body.

16. The system of claim 15, wherein said detector is arranged to detect infrared (IR) radiation absorption by said SiC body.

17. The system of claim 15, wherein said detector is arranged to detect increases in the resistance of said SiC body in response to said body receiving radiation having a wavelength less than about 10 micrometers.

18. The system of claim 15, further comprising a filter arranged to limit the reception of radiation by said SiC body to a narrow wavelength band.

19. An electromagnetic radiation detection method, comprising:

irradiating a body of single crystal SiC at least 200 microns thick with electromagnetic radiation having a wavelength less than about 10 micrometers, and detecting a response of said SiC body to said radiation.

20. The method of claim 19, wherein said response is detected by detecting acoustic absorption by said SiC body of said radiation.

21. The method of claim 20, wherein said SiC body is irradiated with infrared (IR) radiation.

22. The method of claim 20, wherein said acoustic absorption is detected by detecting increases in the resistance of said SiC body in response to said radiation.

23. The method of claim 19, further comprising the step of filtering said radiation to a narrow wavelength band prior to irradiating said SiC body.

24. An electromagnetic radiation detection method, comprising:

irradiating a body of single crystal SiC with radiation having a wavelength less than about 10 micrometers, and detecting acoustic absorption of said radiation by said body.

25. The method of claim 24, wherein said SiC body is irradiated with infrared (IR) radiation.

26. The method of claim 24, wherein said acoustic absorption is detected by detecting increases in the resistance of said SiC body in response to said radiation.

27. The method of claim 24, wherein said acoustic absorption is detected over a broad bans of wavelengths.

28. The method of claim 24, further comprising the step of filtering said radiation to a narrow wavelength band prior to irradiating said SiC body.

* * * * *